US012776790B2

(12) United States Patent
Gammel et al.

(10) Patent No.: US 12,776,790 B2
(45) Date of Patent: Oct. 27, 2026

(54) ERROR CORRECTION DEVICE AND METHOD FOR CORRECTING A DATA BLOCK

(71) Applicant: Infineon Technologies AG, Neubiberg (DE)

(72) Inventors: Berndt Gammel, Markt-Schwaben (DE); Rainer Göttfert, Putzbrunn (DE); Stefan Seidl, Unterhaching (DE); Martin Schläffer, Zell am See (AT)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 18/882,947

(22) Filed: Sep. 12, 2024

(65) Prior Publication Data

US 2025/0088205 A1 Mar. 13, 2025

(30) Foreign Application Priority Data

Sep. 12, 2023 (DE) ......................... 102023124620.8

(51) Int. Cl.
*H03M 13/00* (2006.01)
*H03M 13/15* (2006.01)
*H03M 13/29* (2006.01)

(52) U.S. Cl.
CPC ..... *H03M 13/2948* (2013.01); *H03M 13/154* (2013.01); *H03M 13/1575* (2013.01)

(58) Field of Classification Search
CPC .. H03M 13/00; H03M 13/13; H03M 13/2948; H03M 13/154; H03M 13/1575
See application file for complete search history.

(56) References Cited

U.S. PATENT DOCUMENTS 5,920,578 A 7/1999 Zook
7,913,151 B1 * 3/2011 Gorshe ................. H03M 13/15 714/775
8,261,167 B1 9/2012 Northcott
8,446,660 B2 * 5/2013 Suzuki .................. G02F 1/1533 359/242
8,533,564 B2 * 9/2013 Yurzola ............... G06F 11/1048 714/763

(Continued)

FOREIGN PATENT DOCUMENTS

DE 102013109315 A1 3/2015
JP H11143787 A 5/1999

*Primary Examiner* — Esaw T Abraham
(74) *Attorney, Agent, or Firm* — Murphy, Bilak & Homiller, PLLC

(57) ABSTRACT

A method for correcting a data block comprises correcting the data block in one or more iterations, each iteration comprising applying a first error correction and error detection method in accordance with a first code to a first set of vectors, wherein vectors of the first set of vectors for which t errors are detected but cannot be corrected by the error correction in accordance with the first code are marked, and applying a second error correction and error detection method in accordance with a second code to at least one portion of a second set of vectors, wherein the correction of vectors of the second set of vectors which contain one or more errors that could be corrected in accordance with the second code but relate to entries that do not belong to vectors of the marked vectors of the first set of vectors are skipped.

7 Claims, 15 Drawing Sheets

(56) References Cited

U.S. PATENT DOCUMENTS

| | | | | |
|---|---|---|---|---|
| 8,560,892 | B2 * | 10/2013 | Nicholes | G06F 11/1048<br>714/6.1 |
| 8,621,317 | B1 * | 12/2013 | Cypher | H03M 13/2927<br>714/755 |
| 8,775,899 | B2 * | 7/2014 | Kamoshida | H03M 13/2927<br>714/764 |
| 11,126,500 | B2 * | 9/2021 | Fuller | H03M 13/2906 |
| 11,200,117 | B2 * | 12/2021 | Lee | G06F 11/1068 |
| 11,416,335 | B2 * | 8/2022 | Cho | G06F 11/1048 |
| 11,438,015 | B2 * | 9/2022 | Lu | G11C 29/42 |
| 11,710,030 | B2 * | 7/2023 | Mody | G06F 11/1004<br>706/15 |
| 12,423,415 | B2 * | 9/2025 | Chhabra | G06F 21/71 |
| 2019/0258541 | A1 * | 8/2019 | Wu | H03M 13/3707 |

* cited by examiner

ERROR CORRECTION DEVICE AND METHOD FOR CORRECTING A DATA BLOCK

TECHNICAL FIELD Exemplary embodiments generally relate to error correction devices and methods for correcting data blocks.

BACKGROUND

In order to enable the correction of errors in data which have arisen during data transmission or during storage or readout, for example, data are typically encoded by means of a code. Such a code can also be used for example to enable the reconstruction of a value provided by a POK (Physically Obfuscated Key). In both cases it is necessary to correct an erroneous data block obtained. It is desirable here also to be able to correct data blocks having a high number of errors, without needing to provide an excessively high quantity of additional data (e.g. check bits, auxiliary data, etc.). The intention here is also to minimize the risk of decoding errors (i.e. incorrectly corrected entries).

SUMMARY

In accordance with one embodiment, a method for correcting a data block is provided, comprising:

- representing the data block as a matrix having a first set of vectors and a second set of vectors, the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector which corresponds to the component of the vector of the first set; and
- correcting the data block in one or more iterations, each iteration comprising
  - applying a first error correction and error detection method in accordance with a predefined first code to the first set of vectors (e.g. rows), wherein entries of vectors of the first set of vectors of the matrix are corrected which can be corrected by the error correction in accordance with the first code, and vectors of the first set of vectors for which the fact that they contain errors is detected, but which cannot be corrected by the error correction in accordance with the first code, are (correspondingly) marked; and (thereafter)
  - applying a second error correction and error detection method in accordance with a predefined second code to at least one portion of the second set of vectors (e.g. columns), wherein during the error correction by means of the second error correction and error detection method, the correction of vectors of the second set of vectors which (each) contain one or more errors which (indeed) could be corrected in accordance with the second code, but relate to entries which do not belong to vectors of the first set of vectors which were marked, is skipped.

In accordance with a further embodiment, an error correction device is provided which is configured to carry out the above-described method for correcting a data block.

BRIEF DESCRIPTION OF THE FIGURES

The figures do not reflect the actual proportions but are intended to be used to illustrate the principles of the various exemplary embodiments. Various exemplary embodiments are described below with reference to the following figures.

DETAILED DESCRIPTION

The following detailed description refers to the accompanying figures, which show details and exemplary embodiments. These exemplary embodiments are described in such detail that a person skilled in the art can carry out the invention. Other embodiments are also possible and the exemplary embodiments can be changed in structural, logical and electrical terms without departing from the subject matter of the invention. The various exemplary embodiments are not necessarily mutually exclusive; rather, various embodiments can be combined with one another to produce new embodiments. In the context of this description, the terms “connected”, “attached” and “coupled” are used to describe both a direct and an indirect connection, a direct or indirect attachment and a direct or indirect coupling.

Figure 1:
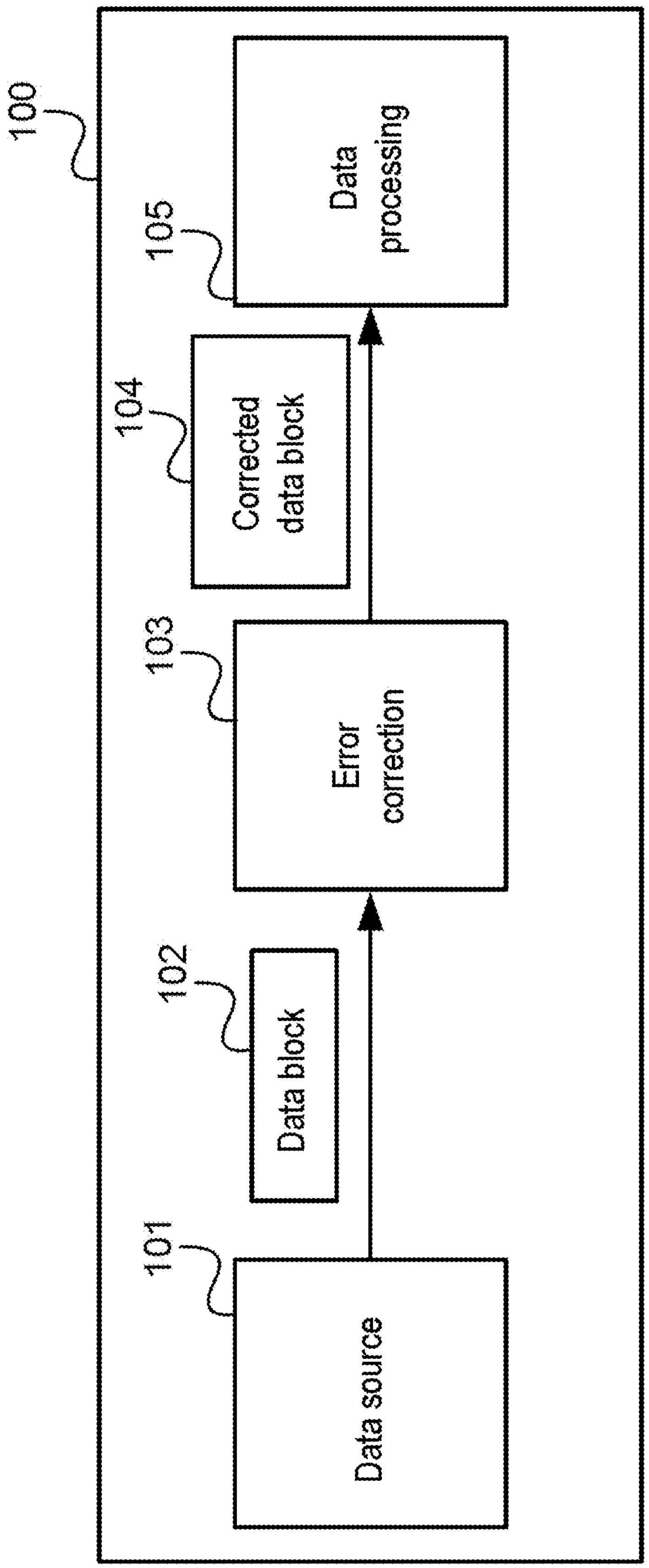
FIG. 1 shows a data processing device in accordance with one embodiment.

FIG. 1 shows a data processing device 100 in accordance with one embodiment.

The data processing device 100 comprises a data source 101, which supplies a data block 102 (e.g. of a sequence of data blocks). The data block 102 is firstly fed to error correction 103, which (ideally) corrects errors in the data block 102, i.e. generates a corrected data block 104, which is then fed to (further) data processing 105.

The data processing device 100 can be any type of data processing device such as, for example, a computer or a smartphone, a smart card (with any form factor) or a control device (e.g. with a microcontroller) that is used in a vehicle, for example.

Accordingly, the data source 101 can also be of a wide variety of types. It can be a (e.g. nonvolatile) memory from which data blocks are read that are possibly erroneous, such as e.g. a flash memory; it can be a receiver via which the data processing device 100 receives data blocks possibly adversely affected by transmission errors; or it can also be a source of physical fingerprints, such as POK (Physical Obfuscated Key) values, which have to be corrected for a POK value reconstruction. The data block is accordingly a block of bits which represents received data, a memory content, e.g. one or more data words or a POK value (or value of a physical uncloneable function). The data source 101 can for example also contain biometric data which are intended to be corrected. The processing 105 can accordingly be processing of received data, memory contents, biometric data and/or else a cryptographic operation.

The error correction 103 and the processing 105 can be carried out by separate circuits or else by the same processor. The error correction 103 is carried out by an error correction device comprising software and hardware, or hardware alone, and can also be regarded as a decoder circuit depending on the application.

The data block 102 is a possibly corrupted version A' of an original data block A. One efficient method for correcting an erroneous data block A' is the use of a product code.

In this case, the data block A' is represented as a matrix:

$$A' = \begin{pmatrix} a'_{11} & a'_{12} & \dots & a'_{1n} \\ a'_{21} & a'_{22} & \dots & a'_{2n} \\ \dots & \dots & \dots & \dots \\ a'_{m1} & a'_{m2} & \dots & a'_{mn} \end{pmatrix}$$

and it is assumed that in the original data block $$A = \begin{pmatrix} a_{11} & a_{12} & \dots & a_{1n} \\ a_{21} & a_{22} & \dots & a_{2n} \\ \dots & \dots & \dots & \dots \\ a_{m1} & a_{m2} & \dots & a_{mn} \end{pmatrix}$$

the rows are code words of a first code $C_1$ and the columns are code words of a second code $C_2$ (for example, a transmitter or a memory controller has correspondingly encoded original data) or, in the case where the rows and columns are not code words, as is the case for POK values, auxiliary data are present for the rows and columns, specifically syndromes for all $$HD_1 = [Z(A_1), \dots, Z(A_m)]$$

rows and syndromes for all $$HD_2 = [S(a_1), \dots, S(a_n)]$$

columns.

In both cases, the data block 102 can be corrected by correcting first the rows (in accordance with $C_1$) and then the columns (in accordance with $C_2$) (or vice versa), provided that the data block 102 does not contain too many errors. This is referred to as error correction with product code (comprising $C_1$ and $C_2$) or product code (error correction) strategy. It is assumed in the following examples that correction always involves correcting first the row vectors of the data block 102 represented as a matrix and then the column vectors of the data block 102 represented as a matrix. However, the roles of the rows and columns can also be interchanged. Accordingly, the role of the respective code then also changes (i.e. the roles of $C_1$ and $C_2$ are interchanged).

Figure 2:
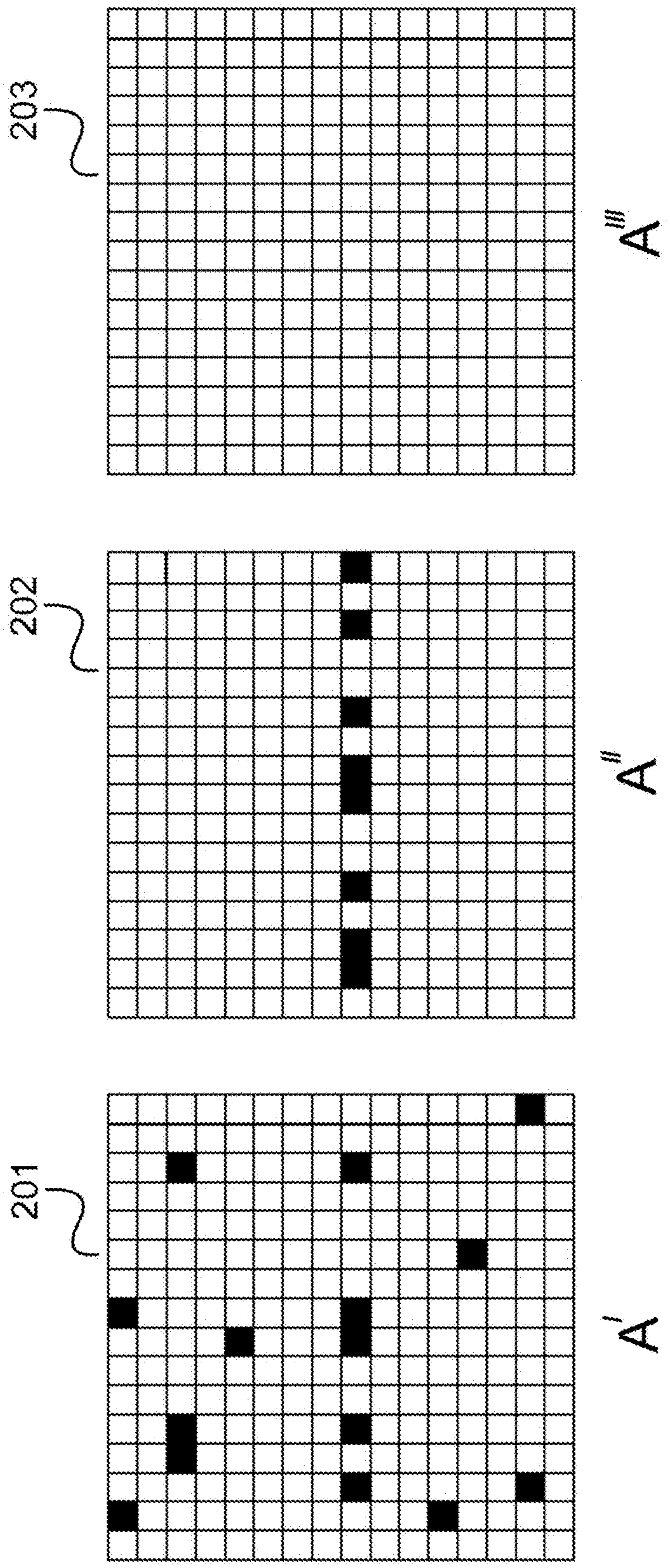
FIG. 2 illustrates the error correction with a product code.

FIG. 2 illustrates the error correction with a product code. In the case of an erroneous data block 201, as referred to above as A', firstly the rows are corrected. In this case, that results in a partially corrected data block 202, referred to as A", in which all erroneous rows apart from one (on account of the high number of errors therein) were able to be corrected. This one row was even corrected so incorrectly that the number of bit errors therein (represented by dark boxes) increased. However, the subsequent column correction is successful for each column because there is at most one error in each column. The column correction therefore leads to an error-free output data block 203, referred to as A'", i.e. A'"=A.

In the following exemplary embodiments, the row code $C_1$ and the column code $C_2$ are linear codes. Each linear code can be assigned a triple (n, k, d), where n is the length of the code, k is the dimension of the code and d is the minimum distance of the code.

If d is odd, d can be written as d=2t+1. If d is even, d can be written as d=2t+2. In both cases, the uniquely determined natural number t indicates the correction strength of the code, i.e. the maximum number of incorrect bits (i.e. bit errors) in a received message vector which the code can still correct (i.e. which can be corrected by a decoder operating in accordance with the code).

If the received message vector contains more than t bit errors, then two cases are possible:

1) In many cases (depending on the specific error), the error correction algorithm (i.e. the decoder) recognizes that bit errors are present (but too many to be corrected). This is indicated by an output of the type "multibit error is present". It is assumed hereinafter that the decoder outputs this by the output of the symbol "M". It is then known that the message is erroneous (even if the decoder cannot correct it).
2) The second possibility is that the decoder outputs an incorrect error vector (i.e. it indicates at least one bit error for a position which is not erroneous and/or does not indicate a bit error for a position which is erroneous). A decoding error is thus present. This case is more serious since the decoder gives the impression of having corrected the bit errors, but in reality the original error was increased. Without additional information from another source, however, the decoder is not able to avoid the decoding error. Occasional decoding errors are thus typically unavoidable.

One example of the second case is the ninth row in the example in FIG. 2, in which the row correction has worsened the error. Nevertheless, the product code can still be used to carry out correction correctly since there is only at most one bit error present per column in the partially corrected data block 202 (where it is assumed that the column correction code can correct one bit error or more, i.e. the parameter t for the column code is at least 1).

As a generalization, if the row code $C_1$ is a linear ($n_1$, $k_1$, $d_1$) code and the column code $C_2$ is a linear ($n_2$, $k_2$, $d_2$) code, correction can be carried out correctly if the number $\alpha$ of rows that the row code has marked with M and the number $\beta$ of rows that the row code has corrected incorrectly satisfy the inequality $\alpha+2\beta<d_2$ (where it is assumed that the column code treats the rows that the row code has marked with M as erasures, i.e. error- (and-)erasure decoding is used).

Approaches are described below which make it possible to correct various error patterns, even though $\alpha+2\beta\geq d_2$.

In accordance with one embodiment, an approach is used which is referred to as "cautious column correction". It includes the following procedure:

1. The rows of the received matrix (i.e. of the data brought to matrix form) are corrected using the row code $C_1$. The numbers of the rows in which a multibit error was discovered are combined in a set $\mathcal{M}=\{i_1, i_2, \ldots, i_r\}$. However, the row entries of these rows are not erased (as would be the case for error-erasure decoding).
2. The column code $C_2$ is then used in an attempt to correct a column (e.g. the first column). If the column code detects an (uncorrectable) multibit error, then nothing further is undertaken, rather the procedure continues with the next column.
3. If the decoder outputs an error vector during the correction using the column code $C_2$ for a column, then this error vector is accepted only if all error positions are elements of the set $\mathcal{M}$. If not, then nothing further is undertaken, rather the procedure continues with the next column.
4. If the column correction has arrived at a column for which the decoder outputs an error vector containing only ones for rows contained in the set $\mathcal{M}$, then the erroneous column entries are corrected.
5. Whenever a column entry has been corrected, directly thereafter the associated row(s) (the row(s) in which the corrected entry/entries is/are situated) is/are subjected to a correction attempt using the row code $C_1$. (This is optional; it is also possible to perform the one or more row corrections only after a plurality of column corrections, possibly even only after a pass through all columns. In the case of product codes used in practice, however, the row code $C_1$ typically has a greater correction strength than the column code $C_2$, that is to say that d1>d2. In such a case it is advantageous to carry out a row correction directly after each column correction since generally during the row correction (directly after the correction of a column bit) a plurality of bit errors are immediately rectified.)

One example of the procedure of "cautious column correction" is described below with reference to FIGS. 3 to 8.

It is assumed that the row code can correct 3-bit errors and detect, but not correct, 4-bit errors and (at least some) 5-bit errors ($d_1=8$) and the column code can correct 2-bit errors but not 3-bit errors ($d_2=5$). By way of example, the row code is the (15, 4, 8) simplex code and the column code is the (15, 7, 5) BCH code. In the case of the row code, all 1-, 2- and 3-bit errors are corrected. All 4-bit errors are recognized (and marked with M). Larger errors are either recognized (and marked with M) or lead to a decoding error. In the case of the column code, all 1- and 2-bit errors are corrected. Larger errors are either recognized (and marked with M) or lead to a decoding error.

In addition, it is assumed that the column correction takes place from left to right.

Figure 3:
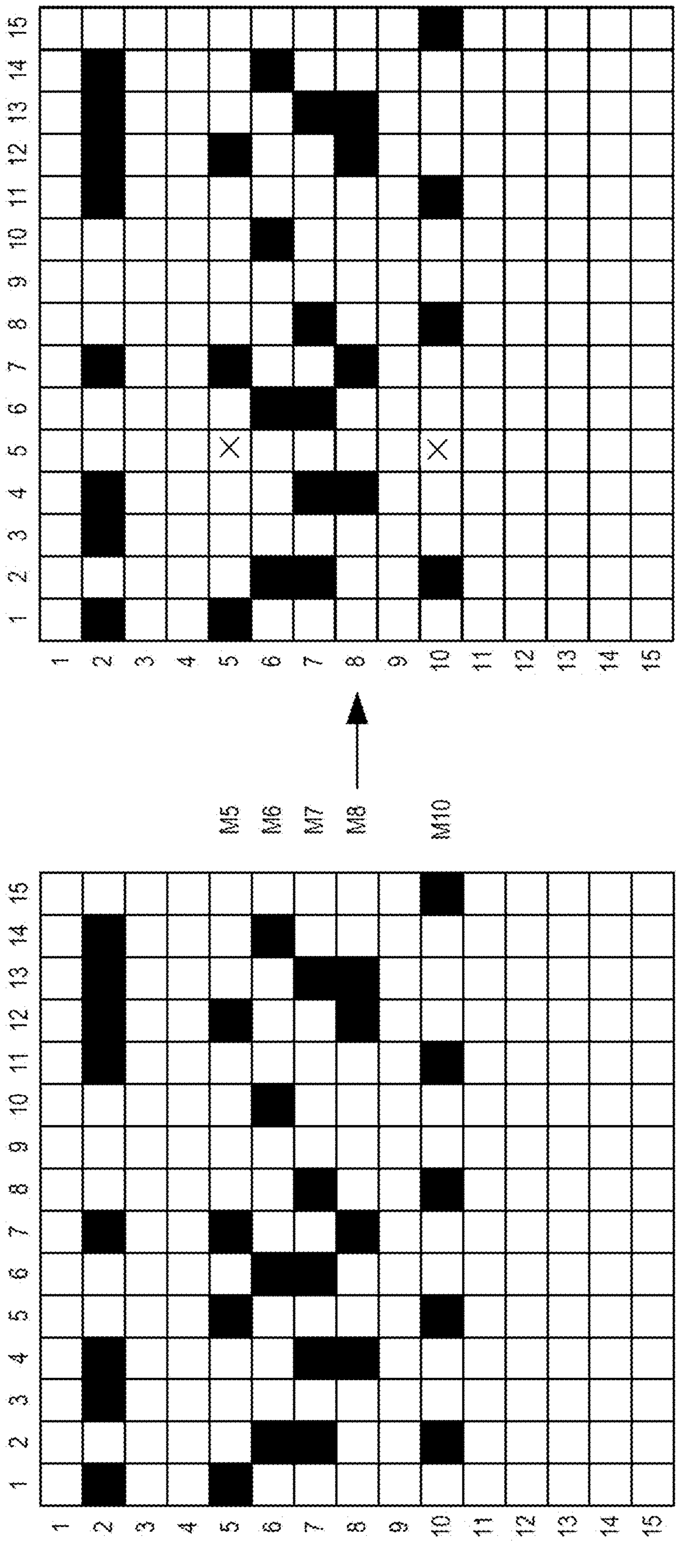
FIG. 3 shows the correction of a data block by way of a column correction.

FIG. 3 shows the correction of a data block in which row 2 was corrected incorrectly during the row correction and "M" was output for each of the rows 5, 6, 7, 8, 10 (i.e. $\mathcal{M}=\{5, 6, 7, 8, 10\}$). The correction shown is the correction of the fifth column. This is completely successful and is accepted since both errors (fifth and tenth rows) are in the set $\mathcal{M}$. The column correction of columns 1 to 4 has not achieved anything since

- columns 2 and 4 contain too many errors for the column code to be able to correct them (namely three in each case).
- columns 1 and 3 contain errors not just in rows of the set $\mathcal{M}$.

Figure 4:
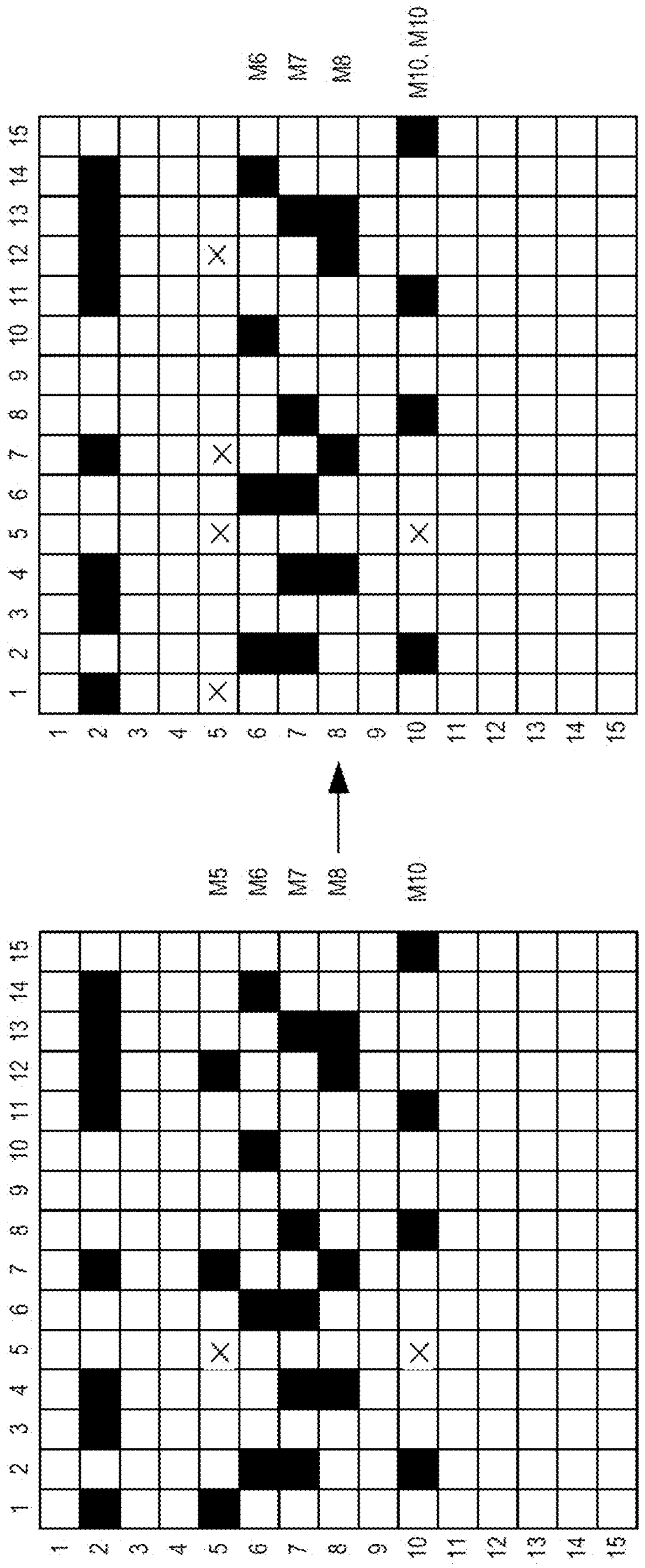
FIG. 4 shows the row correction following the column correction from FIG. 3.

FIG. 4 shows the row correction following the column correction from FIG. 3.

The row code can now correct the fifth row, but still cannot correct the tenth row (even though it has one error fewer). Consequently, $\mathcal{M}=\{6, 7, 8, 10\}$ now holds true.

Figure 5:
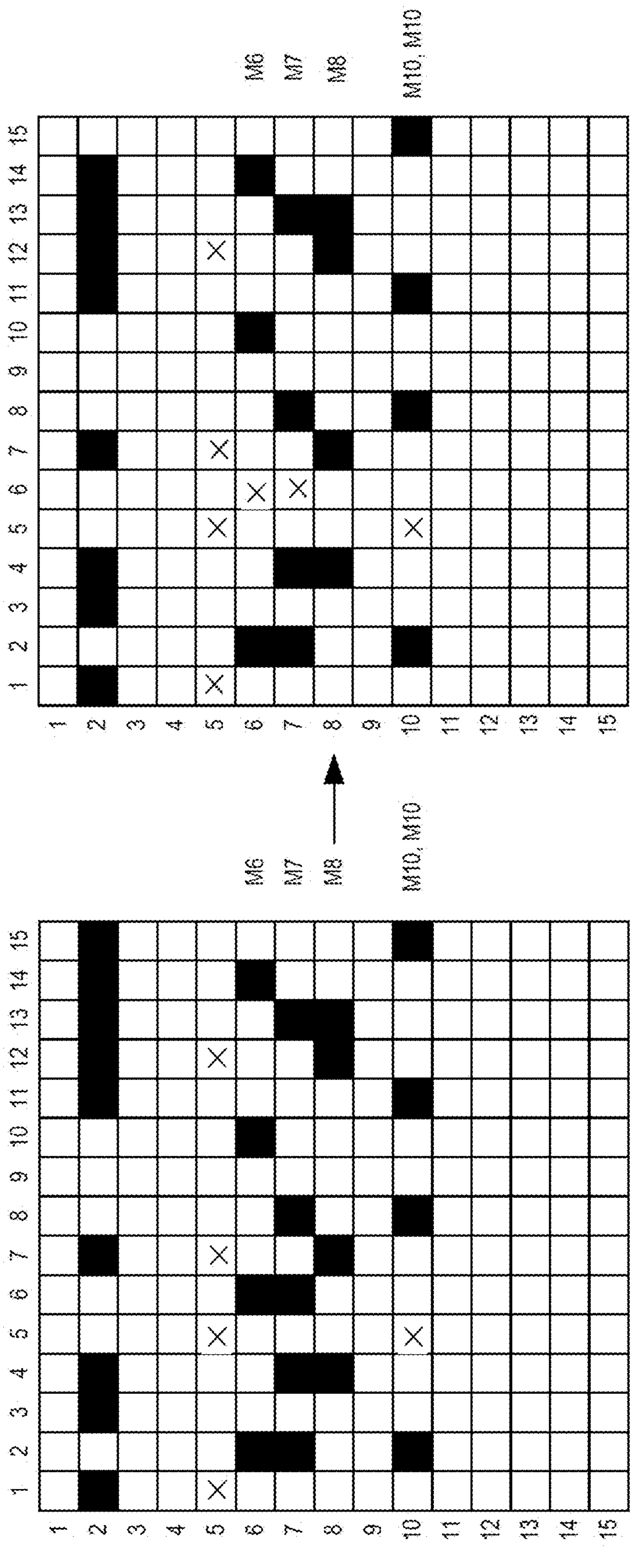
FIG. 5 shows the column correction following the row correction from FIG. 4.

FIG. 5 shows the column correction following the row correction from FIG. 4. The first erroneous column from the left which is correctable by the column code and contains only errors in rows of the set $\mathcal{M}$ is the sixth column.

Figure 6:
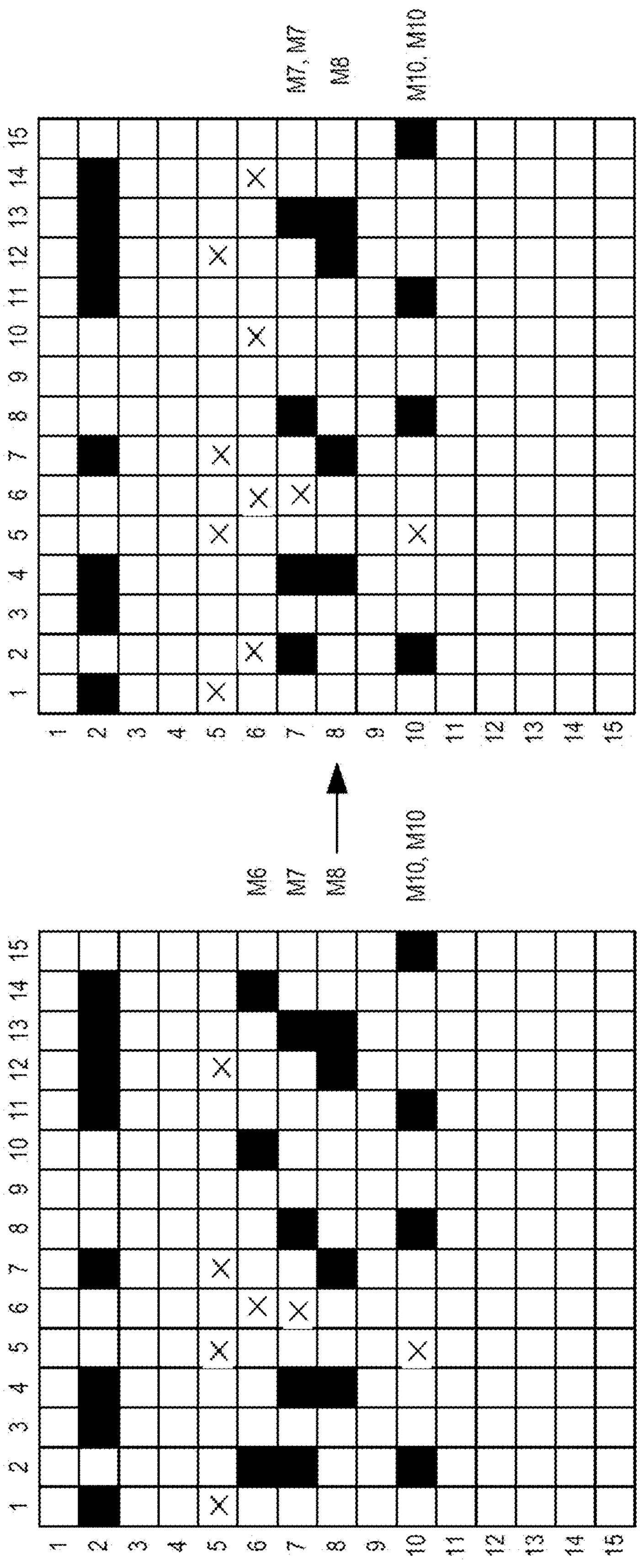
FIG. 6 shows the row correction following the column correction from FIG. 5.

FIG. 6 shows the row correction following the column correction from FIG. 5.

The row code can now correct the sixth row, but still cannot correct the seventh row (even though it has one error fewer). Consequently, $\mathcal{M}=\{7, 8, 10\}$ now holds true.

Figure 7:
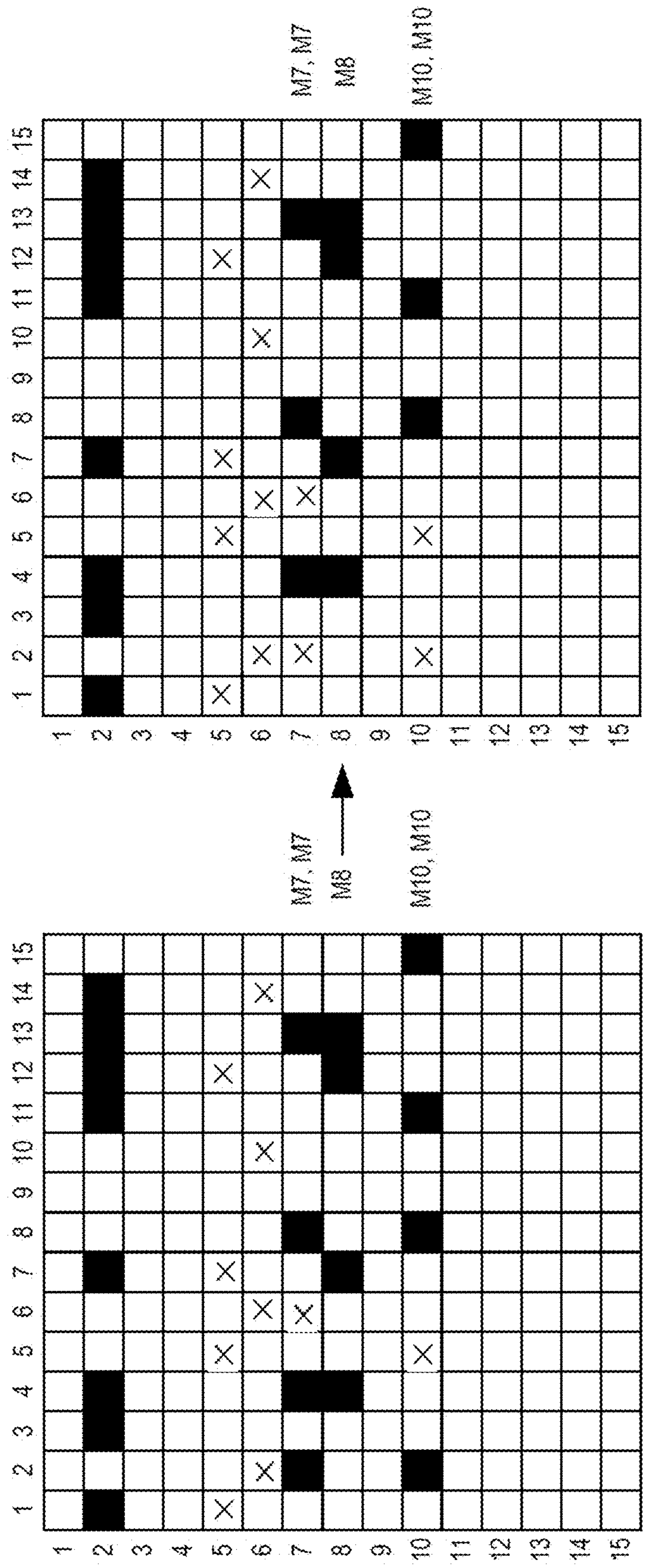
FIG. 7 shows the column correction following the row correction from FIG. 6.

FIG. 7 shows the column correction following the row correction from FIG. 6. The first erroneous column from the left which is correctable by the column code and contains only errors in rows of the set $\mathcal{M}$ is the second column.

Figure 8:
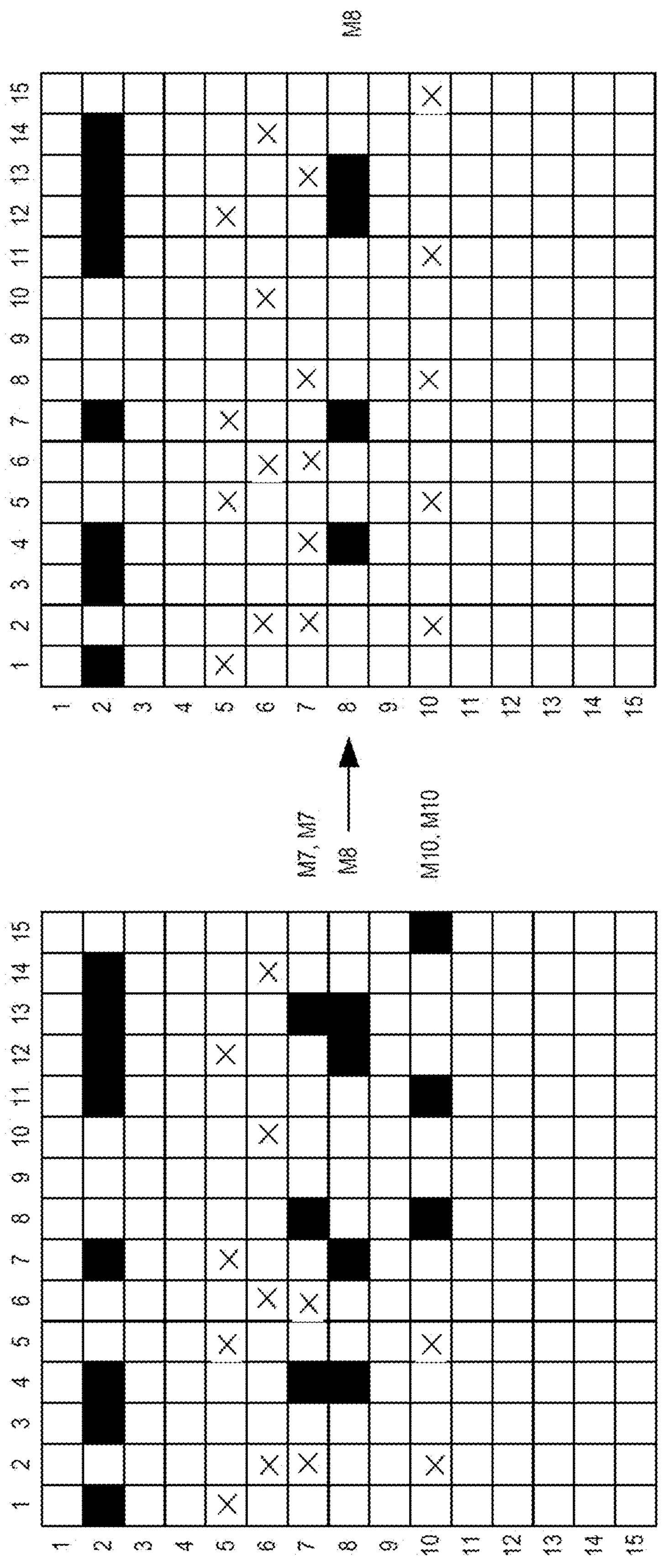
FIG. 8 shows the row correction following the column correction from FIG. 7.

FIG. 8 shows the row correction following the column correction from FIG. 7.

The row code can now correct the seventh and tenth rows. Consequently, $\mathcal{M}=\{8\}$ now holds true.

The above procedure now ends since although each correctable column (columns 4, 7, 12 and 13) has an error in the row marked with M by the row code, it also has an error in row 2, which was not marked with M by the row code (because it was corrected incorrectly by the latter).

Thus the column code now yields the error pattern {2}, { }, {2}, {2, 8}, { }, { }, {2,8}, { }, { }, { }, {2}, {2,8}, {2,8}, {2}, { }from left to right for the columns, where "{ }" indicates freedom from errors and one or two digits indicate(s) the respective erroneous row(s). The column code does not output a multi-error indication. Accordingly, the decoder can conclude that rows 2 and 8 are erroneous, and can correct this error "in a traditional way" (by erasing rows 2 and 8).

By virtue of the "cautious column correction", i.e. correction (right to the last step) only if all bit errors lie in rows marked with M by the column code, the risk of a decoding error during a column correction decreases.

If there is initially the set $\mathcal{M}=\{i_1, i_2, \ldots, i_r\}$, then this means that in the course of the initially executed row correction using the row code $C_1$, exactly r rows with a multibit error were identified. Using traditional error-erasure decoding (in which the rows marked with M by the row correction are treated as erasures by the column correction), the column code can no longer correct the matrix as soon as r≥d2. Using the above procedure, however, errors with certain bit error patterns are nevertheless correctable, even if r>d2 holds true (as in the above example in FIG. 3 to FIG. 8, where $r=5>4=d_2$).

In accordance with one embodiment, an approach is used which is referred to as "correction return". It includes the following procedure:

If a column is corrected (for example, if "cautious column correction" is used, if all errors found during the column correction lie in rows that the row correction has marked with M—however, "correction return" is also usable independently of "cautious column correction"), a row correction is carried out thereafter for each row that has changed as a result of this column correction (as explained above in association with step 5 of "cautious column correction").

All those rows are now considered which were previously marked with M by the row correction and for which a row correction is now carried out (if "cautious column correction" is used, these are all rows for which a row correction is now carried out because the column correction was carried out only then; see step 3 of "cautious column correction").

As explained above, t1 is the maximum number of bit errors that is correctable using the row code $C_1$.

If, during the row correction, during the attempt to correct a row (which was previously marked with M), a multibit error is now indicated again, then that is noted without anything further being done and the row remains marked with M. The following is assumed as a probable reason: The original number of bit errors in the row has decreased by one during the column correction, but the row still contains too many errors, and so a multibit error indication once again appears.

If the row correction reveals that a t1-bit error is present (i.e. the error vector output by the decoder contains exactly t1 ones), then the row is correspondingly corrected (and it is then no longer marked as M).

However, if the decoder outputs an error vector having fewer than $t_1$ ones during the row correction, then the row is not executed in a corrected manner. Moreover, the column correction is reversed (and the row remains marked with M). The motivation for this procedure is that if the decoder outputs an error vector having fewer than $t_1$ ones during the row correction, a decoding error has occurred during the column correction ("cautious column correction" can reduce the probability of decoding errors but cannot exclude the latter). Owing to this decoding error (i.e. a purported but incorrect correction of the column), a further bit error is generated in the row under consideration: The row originally contained an error detected as a multibit error (i.e. a non-correctable but detectable error, i.e. an error having more than $t_1$ ones). Owing to the decoding error during the column correction, this error (increased by one bit) was no longer recognized as a multibit error, but rather leads to a decoding error in the row code: There exists a code word of the row code C1 which is in the vicinity of the (now even more erroneous) row. The row correction then performs correction toward this code word, that is to say that the decoder outputs the "difference" between the row and the code word as the purported (small (having fewer than $t_1$ ones) but incorrect) error vector. A "large" error vector having more than $t_1+1$ ones is actually present.

One example of the procedure of "correction return" is described below with reference to FIGS. 9 to 11 ("cautious column correction" also being used in this example).

Figure 9:
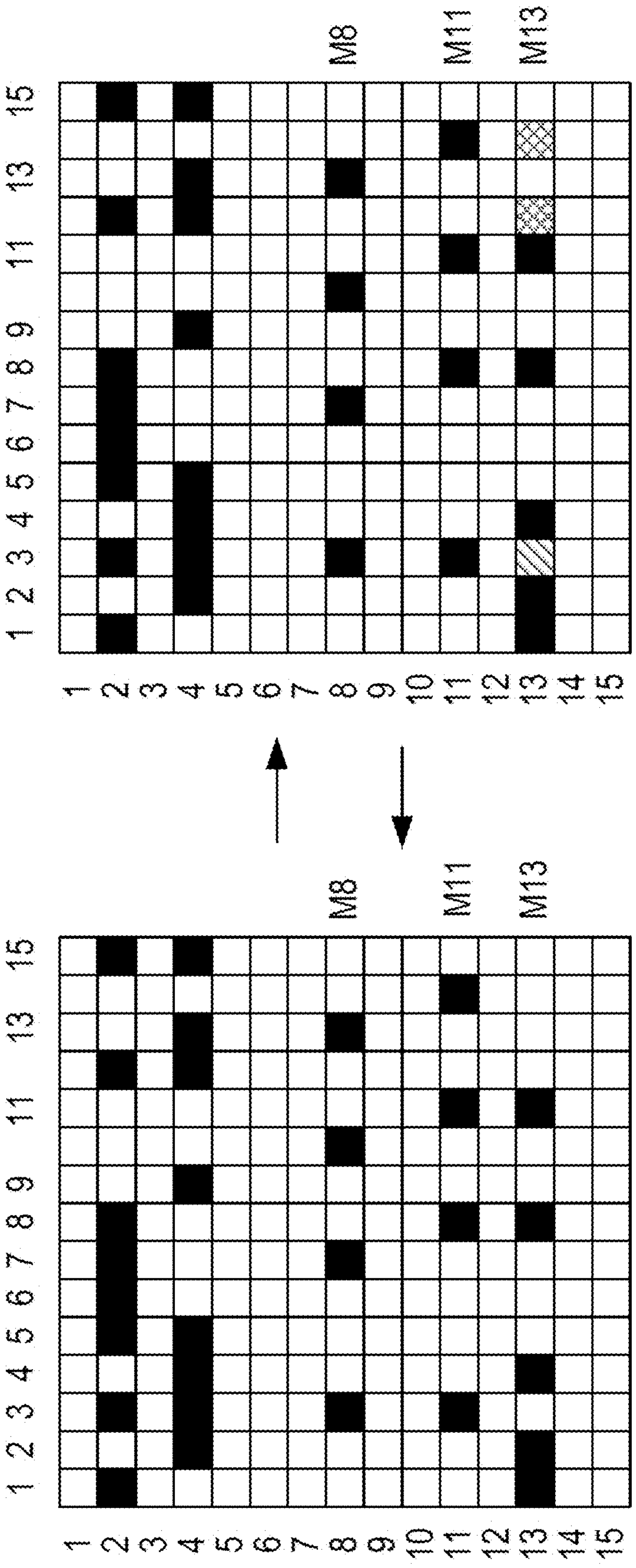
FIG. 9 shows one example with a data block in which the third column is corrected incorrectly during the column correction.

FIG. 9 shows one example in which the third column is corrected incorrectly during the column correction.

This correction changes the 13th row. The latter has originally already been marked with M (since it has five errors and $t_1$ is equal to 3, as also in the example in FIG. 3 to FIG. 8). During the correction of the third column (which contains a 4-bit error), the column code (which has the minimum distance of 5) corrects a 1-bit error incorrectly, that is to say that an additional error arises (obliquely hatched square). The 13th row consequently contains a 6-bit error.

The row code (which has the minimum distance of 8) would now correct the 13th row incorrectly (decoding error): It would correct two bits incorrectly, such that two additional errors (crosshatched squares) would arise.

However, this incorrect row correction is avoided by way of the "correction return" procedure: The row correction of the 13th row indicates a two-bit error after the column correction. With a correct history, however, this is not possible: Since the 13th row had already been marked with M before the column correction of the third column, it had to have at least one 4-bit error and, consequently, after the column correction of the third column, would still have to have at least one 3-bit error (and correct the latter or, if 4 or more bits are still incorrect, once again output an M). The fact that the row correction now indicates a 2-bit error is therefore an indication that a decoding error has occurred during the column correction. Therefore, in accordance with "correction return", the row correction of the purported 2-bit error is not carried out and the column correction of the third column is revoked.

If this procedure is continued further (from left to right through the columns), only the column correction of column 10 is accepted.

Figure 10:
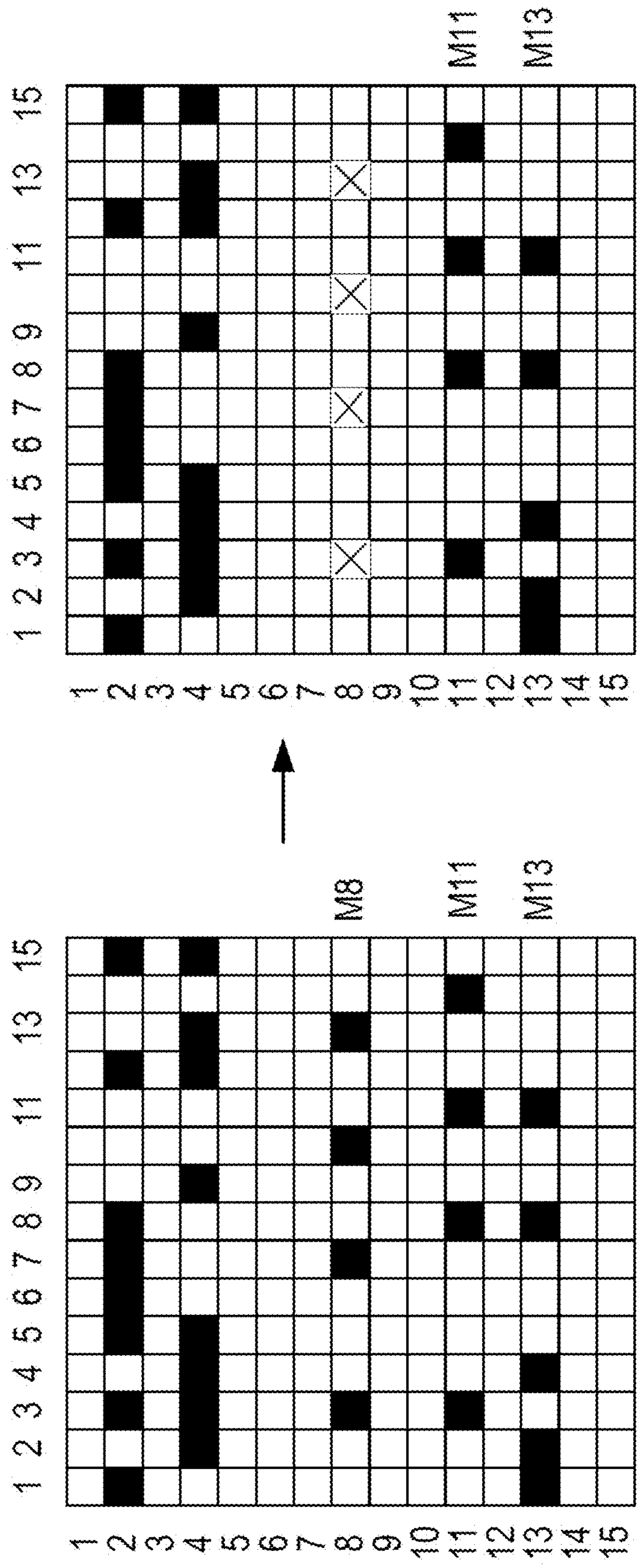
FIG. 10 shows the column correction of column 10 of the data block from FIG. 9 and the subsequent row correction of row 8.

FIG. 10 shows the column correction of column 10 and the subsequent row correction of row 8. Row 8 had previously been marked with M and after the column correction of column 10, according to row correction, still has a 3-bit error. This is plausible and the row correction of row 8 is therefore accepted.

Figure 11:
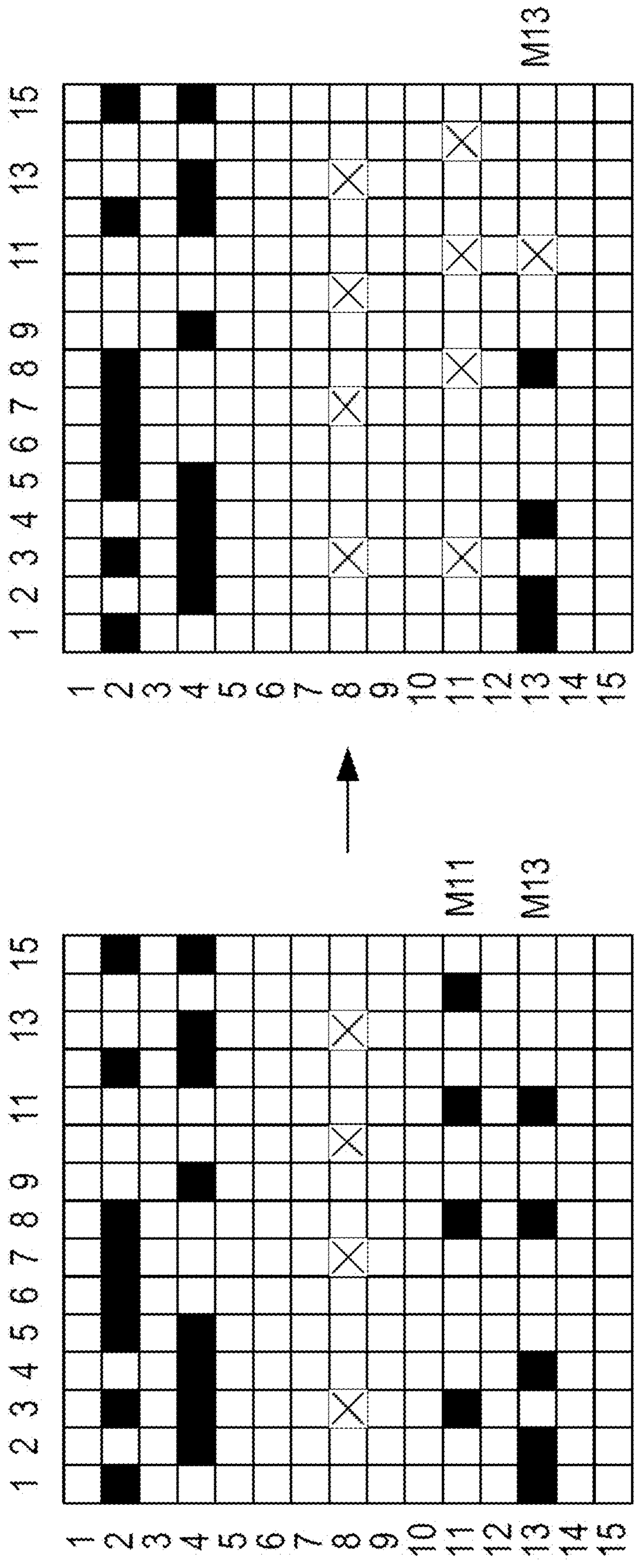
FIG. 11 shows the column correction of column 14 following the corrections from FIG. 10, and the subsequent row correction of row 11 and also the subsequent column correction of column 11.

FIG. 11 shows the column correction of column 14 and the subsequent row correction of row 11 and also the subsequent column correction of column 11.

Only the 13th row remains as a row marked with M. The column correction yields the following errors {2, 13}, {4, 13}, {2, 4}, {4, 13}, {2, 4}, {2}, {2}, {2, 13}, {4}, { }, { }, {2, 4}, {4}, { }, {2, 4}, all of these not being accepted in accordance with "cautious column correction".

However, the union of all these 15 sets is {2, 4, 13} and, owing to $3<d_2-1=4$, a correction using traditional error-erasure decoding is possible.

A further procedure used in accordance with various embodiments is referred to as "majority assessment" and is described below.

This procedure is independent of "cautious column correction" and "correction return" and can be applied in cases in which these two procedures have exhausted their options: Through repeated application of "cautious column correction" and downstream row corrections (taking into account "correction return"), the set $\mathcal{M}=\{i_1, i_2, \ldots, i_r\}$ has (normally) decreased greatly or even turned into the empty set. If the set $\mathcal{M}$ thus cannot decrease further (or has already become empty), "cautious column correction" with "correction return" has exhausted its options.

"Majority assessment" can then be used. This includes the following procedure:

1. Correct all columns of the current matrix in the column code $C_2$. All error positions (i.e. indices of rows) that arise in the process are collected in a union set V. Possible multibit error indications that occur are ignored.
2. Determine the cardinality $|V|$ of the set V, i.e. the number of elements in V.
3. If $|V|<d_2$, i.e. if the set V contains fewer than $d_2$ elements, then for each element $i \in V$ the i-th row of the data block is marked with M. The correction/reconstruction of the data block can now be concluded using traditional error-erasure decoding.
4. If $|V| \geq d_2$, then select from V those elements which occur as exhibiting errors the most frequently during the column corrections. These elements indicate with high probability the rows that are actually erroneous. The elements that rarely occurred are discarded. These elements are with high probability the result of a decoding error during the column correction carried out. If the set V' thinned in this way contains fewer than $d_2$ elements, then the correction of the data block is completed using traditional error-erasure decoding.

Figure 12:
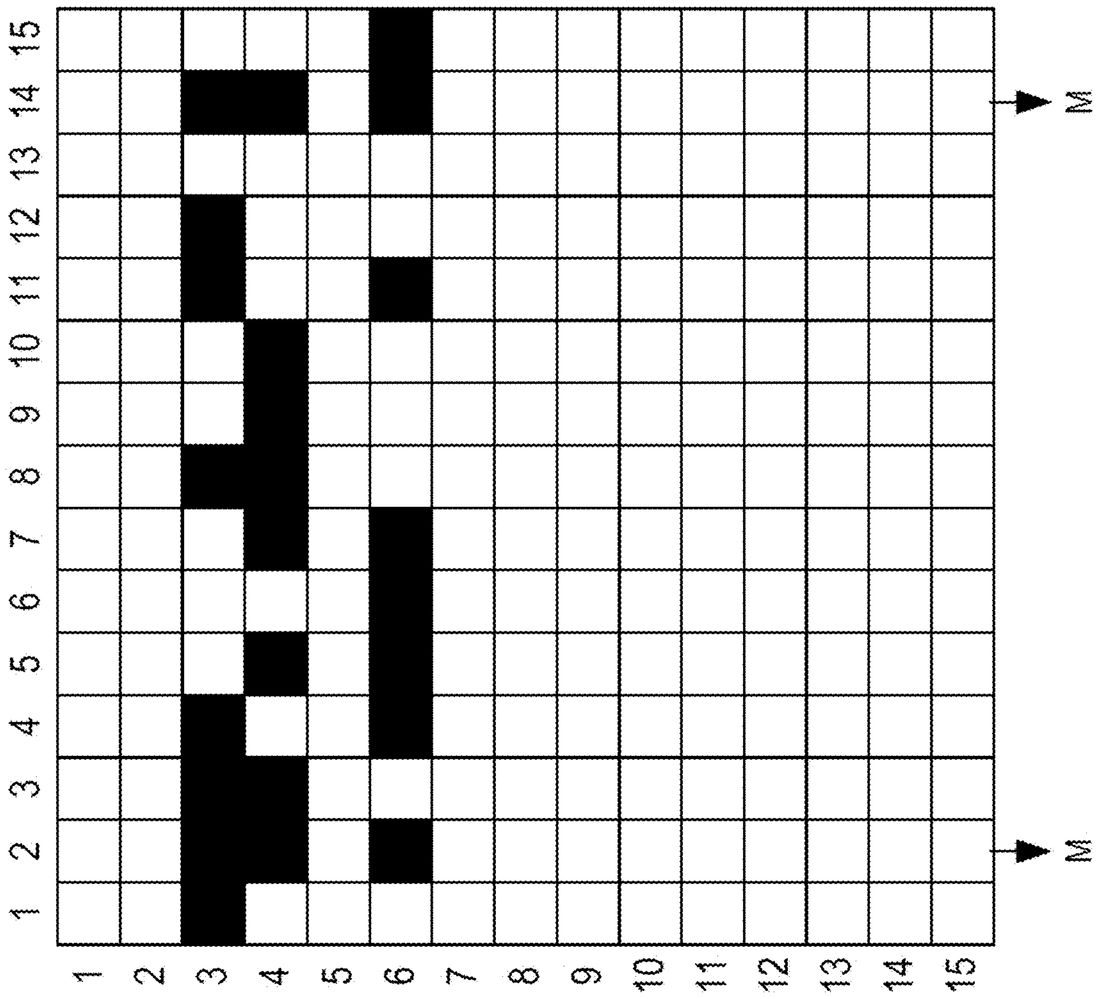
FIG. 12 shows one example of a “majority assessment”.

FIG. 12 shows one example of "majority assessment" where $|V|<d_2$.

It is assumed that the column correction marks columns 2 and 14 with M. The set V here is {3, 4, 6} and hence $|V|=3<5=d_2$. It is thus possible to correct the data block (in accordance with step 3 of "majority assessment") by means of traditional error-erasure decoding (by rows 3, 4, 6 being treated as erasures). It can also be assumed that in the two columns in which column correction is not possible (columns 2 and 14), there are three errors in rows 3, 4 and 6 (since otherwise, too, only errors in these rows occur).

Figure 13:
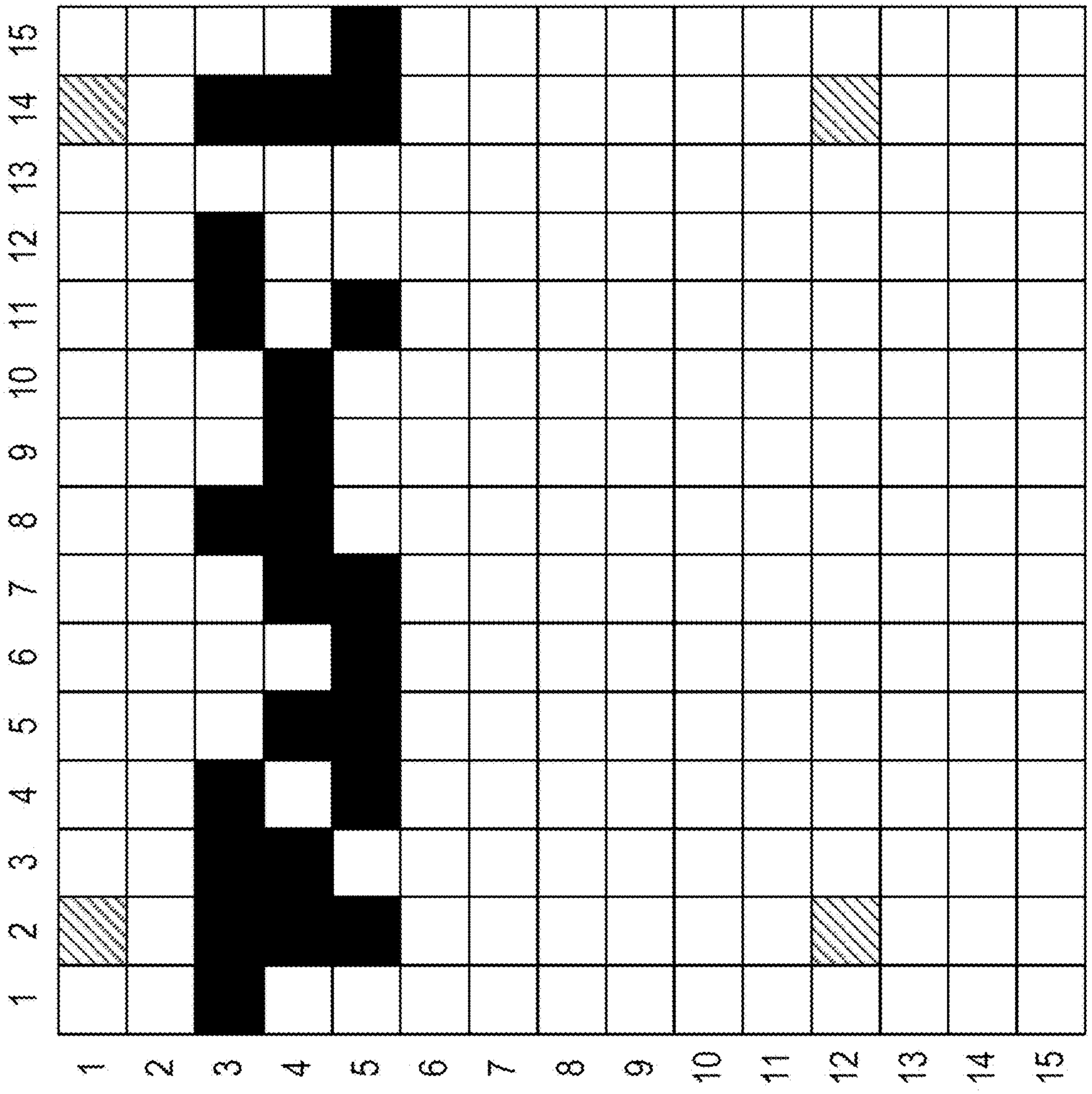
FIG. 13 shows a further example of the “majority assessment”.

FIG. 13 shows one example of "majority assessment" where $|V|>d_2$.

It is now assumed that the column correction does not mark columns 2 and 14 with M, but rather corrects them incorrectly (which leads to additional bit errors, illustrated as hatched squares).

Therefore, the set V here is {1, 3, 4, 5, 12} and hence $|V|=5\geq 5=d_2$.

In accordance with step 4 of "majority assessment", the frequencies with which rows are detected as exhibiting errors during the column correction are considered: Rows 3, 4 and 5 occur six times here, and rows 1 and 12 only twice each. In the sense of "majority assessment", rows 3, 4 and 5 are accepted as exhibiting errors and rows 1 and 12 are ignored (in actual fact, rows 1 and 12 involve indicated 2-bit errors which are indicated incorrectly on account of 3-bit errors in column 2 and column 14). Error-erasure decoding is then carried out, wherein rows 3, 4 and 5 are treated as erasures.

Figure 14:
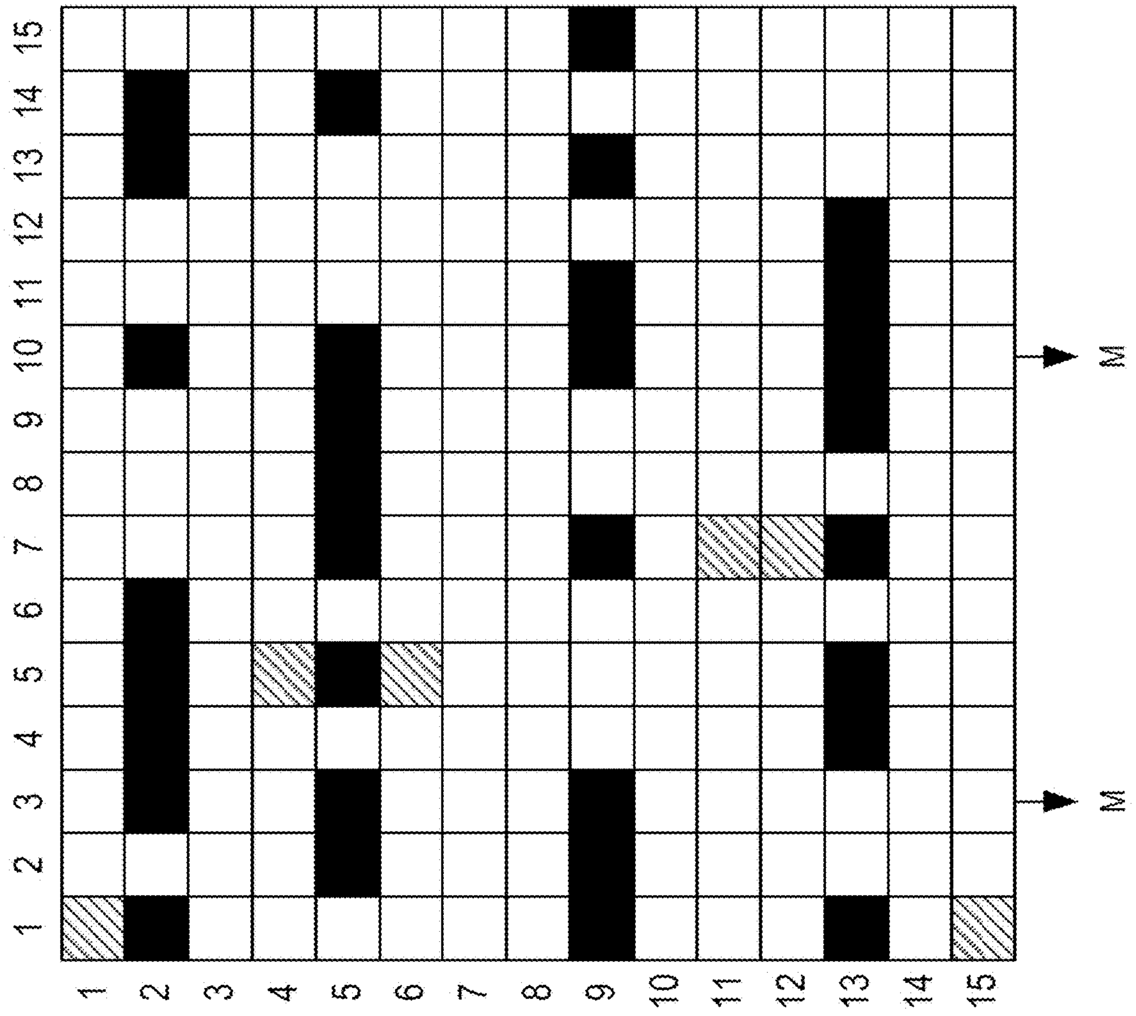
FIG. 14 shows a further example of the “majority assessment”.

FIG. 14 shows a further example of "majority assessment" where $|V|>d_2$.

It is assumed that the column correction corrects columns 1 and 5 incorrectly (which leads to additional bit errors, illustrated as hatched squares), but marks columns 3 and 10 (which also have three bit errors) with M.

Ten erroneous rows are now indicated by the column correction: V={1, 2, 4, 5, 6, 9, 11, 12, 13, 15}

Rows 2, 5, 9 and 13 each occur four times, and rows 1, 4, 6, 11, 12 and 15 only once. In accordance with step 4 of "majority assessment", only the values 2, 4, 9 and 13 are accepted. $4<d_2$ rows thus remain. Error-erasure decoding can thus be carried out, wherein rows 2, 4, 9 and 13 are treated as erasures.

Figure 15:
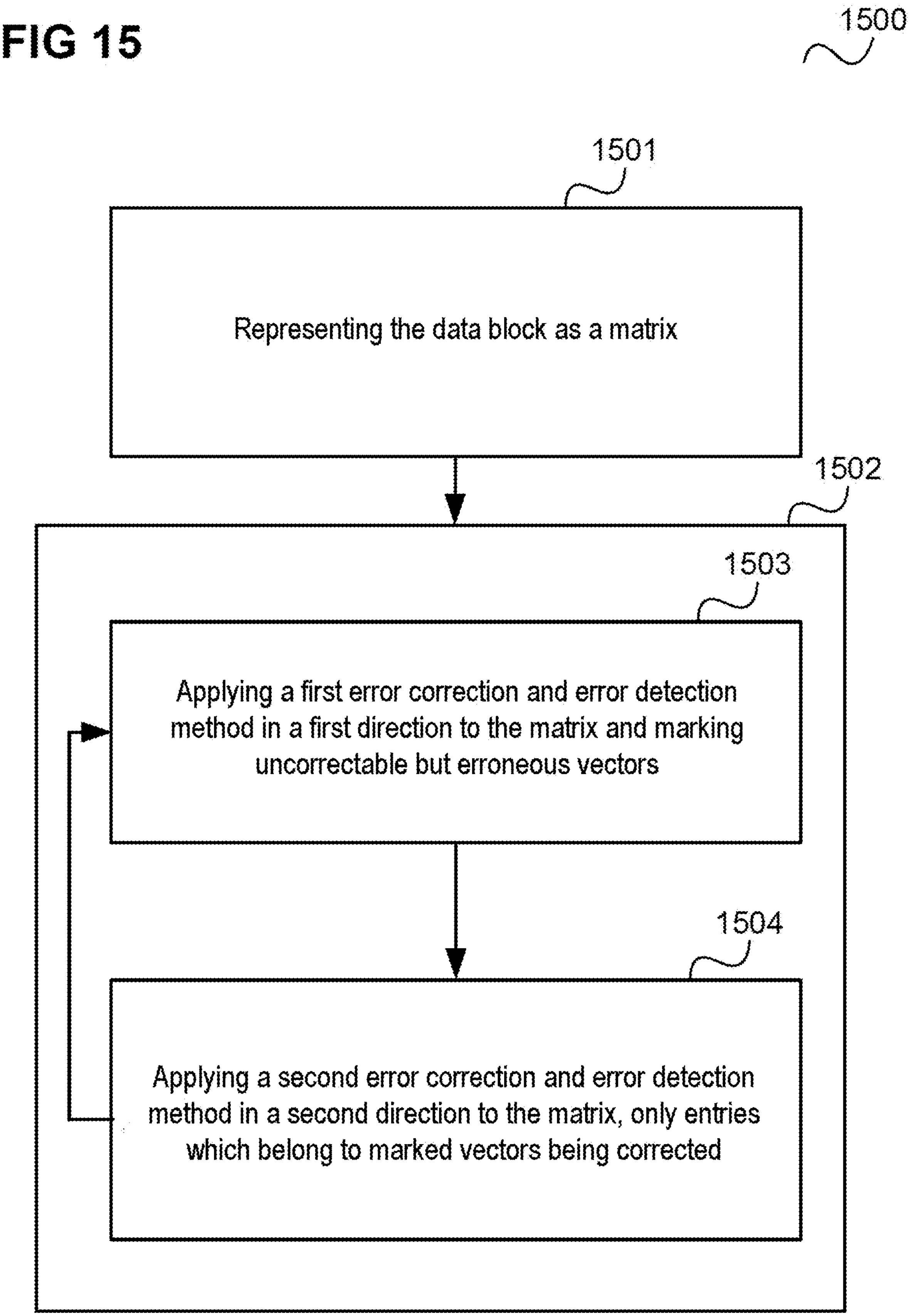
FIG. 15 shows a flowchart illustrating a method for correcting a data block in accordance with one embodiment.

In summary, in accordance with various embodiments, provision is made of a method as illustrated in FIG. 15.

FIG. 15 shows a flowchart 1500 illustrating a method for correcting a data block in accordance with one embodiment.

In 1501 a data block is represented as a matrix having a first set of vectors and a second set of vectors (e.g. stored as a corresponding data structure), the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector which corresponds to the component of the vector of the first set.

In 1502 the data block is corrected in one or more iterations, each iteration comprising in 1503 applying a first error correction and error detection method in accordance with a predefined first code to the first set of vectors, wherein entries of vectors of the first set of vectors of the matrix are corrected which can be corrected by the error correction in accordance with the first code, and vectors of the first set of vectors for which the fact that they contain errors is detected, but which cannot be corrected by the error correction in accordance with the first code, are marked; and.

in 1504 applying a second error correction and error detection method in accordance with a predefined second code to at least one portion of the second set of vectors, wherein during the error correction by means of the second error correction and error detection method, the correction of vectors of the second set of vectors which contain one or more errors which could be corrected in accordance with the second code, but relate to entries which do not belong to vectors of the first set of vectors which were marked, is skipped.

In accordance with various embodiments, in other words, "cautious column correction" is carried out in the sense that column vectors are only corrected if the correction relates to entries of rows that were marked with "M". The role of rows and columns can be interchanged here; therefore, reference is generally made to a first set of vectors and a second set of vectors which in each case when written one below the other or next to one another form the matrix and have components corresponding to one another in this way.

In accordance with one embodiment, an error correction device is provided which is configured to carry out the method described with reference to FIG. 15. This error correction device implements e.g. the error correction 103. Accordingly, the block 103 in FIG. 1 can also be regarded as an error correction device of the data processing device.

The components of the data processing device 100, in particular the error correction device 103, can be realized by one or more circuits. In one embodiment, a "circuit" should be understood as any unit which implements a logic, and which can be hardware, software, firmware or else a combination thereof. Consequently, in one embodiment, a "circuit" can be a hardwired logic circuit or a programmable logic circuit, such as for example a programmable processor, e.g. a microprocessor (e.g. a CISC (Complex Instruction Set Computer) processor or an RISC (Reduced Instruction Set Computer) processor). A "circuit" can also be understood to mean a processor which executes software, e.g. any kind of computer program, for instance a computer program in programming code for a virtual machine, such as e.g. a Java computer program. In one embodiment, a "circuit" can be understood to mean any kind of implementation of the functions described herein.

In accordance with various embodiments, the method described with reference to FIG. 15 is applied to comparatively large data blocks (e.g. more than 32 bits) which comprise data having high error rates (error-prone data transmission, POK values, biometric data, etc.).

Various exemplary embodiments are specified below.

Exemplary embodiment 1 is a method for correcting a data block as described with reference to FIG. 15.

Exemplary embodiment 2 is the method according to exemplary embodiment 1, wherein after each error correction of a vector of the second set of vectors by means of the second error correction and error detection method, the first error correction and error detection method is applied to the vector or vectors of the first set of vectors, with the first error correction and error detection method, which was or were changed by the error correction of the vector of the second set of vectors.

Exemplary embodiment 3 is the method according to exemplary embodiment 1 or 2, wherein the correction strength of the first error correction and error detection method is higher than that of the second error correction and error detection method.

Exemplary embodiment 4 is the method according to any of exemplary embodiments 1 to 3, wherein, if no more errors can be corrected by the iterations, error-erasure decoding is applied in order to end the error correction of the data block.

Exemplary embodiment 5 is the method according to any of exemplary embodiments 1 to 4, wherein the data block is a data block which arose after readout and transmission of an original data block, wherein errors may have arisen during readout and transmission.

Exemplary embodiment 6 is the method according to any of exemplary embodiments 1 to 5, wherein the data block contains physical measurement data or measurement data from a circuit from a semiconductor technology or photonic technology or biometric data and the first error correction and error detection method and the second error correction and error detection method use auxiliary data containing syndromes of an original data block for the error correction of the data block.

Exemplary embodiment 7 is an error correction device, configured for:

- receiving a data block to be corrected; representing the data block as a matrix having a first set of vectors and a second set of vectors, the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector which corresponds to the component of the vector of the first set; and
- correcting the data block in one or more iterations, each iteration comprising
  - applying a first error correction and error detection method in accordance with a predefined first code to the first set of vectors, wherein entries of vectors of the first set of vectors of the matrix are corrected which can be corrected by the error correction in accordance with the first code, and vectors of the first set of vectors for which the fact that they contain errors is detected, but which cannot be corrected by the error correction in accordance with the first code, are marked; and
  - applying a second error correction and error detection method in accordance with a predefined second code to at least one portion of the second set of vectors, wherein during the error correction, the correction of vectors of the second set of vectors which contain one or more errors which could be corrected in accordance with the second code, but relate to entries which do not belong to vectors of the first set of vectors which were marked, is skipped.

Further exemplary embodiments 8 to 13 are specified below and can be provided alternatively or in combination with the above exemplary embodiments 1 to 7 (i.e. it is possible to provide in particular an electronic data processing device or a method which has the features of one of exemplary embodiments 1 to 7 and the features of one of exemplary embodiments 8 to 13).

Exemplary embodiment 8 is a method for correcting a data block, comprising:

- representing the data block as a matrix having a first set of vectors and a second set of vectors, the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector; and
- applying a first error correction and error detection method in accordance with a predefined first code to the first set of vectors, wherein the first code is a code which makes it possible to detect vectors having a number of errors that is above a maximum number as erroneous but uncorrectable vectors, but only to correct vectors having a number of errors that is at most equal to the maximum number of errors;
- applying a second error correction and error detection method in accordance with a predefined second code to at least one portion of the second set of vectors, wherein, if it is established that an error correction of a vector of the second set of vectors has the effect that the first error correction and error detection method, for a vector of the first set of vectors that it has detected as an erroneous but uncorrectable vector, indicates that the number of errors is less than the maximum number, the error correction of the vector of the second set of vectors is revoked.

Exemplary embodiment 9 is the method according to exemplary embodiment 8, wherein after each error correction of a vector of the second set of vectors by means of the second error correction and error detection method, the first error correction and error detection method is applied to the vector or vectors of the first set of vectors, with the first error correction and error detection method, which was or were changed by the error correction of the vector of the second set of vectors.

Exemplary embodiment 10 is the method according to exemplary embodiment 8 or 9, wherein, if it is established that the error correction of the vector of the second set of vectors does not have the effect that the first error correction and error detection method, for a vector of the first set of vectors that it has detected as an erroneous but uncorrectable vector, indicates that the number of errors is less than the maximum number, the error correction of the vector of the second set of vectors is not revoked and each vector of the first set of vectors which the first error correction and error detection method has detected as an erroneous but uncorrectable vector and for which, after the error correction of the vector of the second set of vectors, said method indicates that the number of errors is equal to the maximum number is corrected.

Exemplary embodiment 11 is the method according to any of exemplary embodiments 8 to 10, wherein the data block is a data block which arose after readout and transmission of an original data block, wherein errors may have arisen during readout and transmission.

Exemplary embodiment 12 is the method according to any of exemplary embodiments 8 to 11, wherein the data block contains physical measurement data or measurement data from a circuit from a semiconductor technology or photonic technology or biometric data and the first error correction and error detection method and the second error correction and error detection method use auxiliary data containing syndromes of an original data block for the error correction of the data block.

Exemplary embodiment 13 is an error correction device, configured for:

receiving a data block to be corrected;

representing the data block as a matrix having a first set of vectors and a second set of vectors, the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector which corresponds to the component of the vector of the first set; and applying a first error correction and error detection method in accordance with a predefined first code to the first set of vectors, wherein the first code is a code which makes it possible to detect vectors having a number of errors that is above a maximum number as erroneous but uncorrectable vectors, but only to correct vectors having a number of errors that is at most equal to the maximum number of errors;

applying a second error correction and error detection method in accordance with a predefined second code to at least one portion of the second set of vectors, wherein, if it is established that an error correction of a vector of the second set of vectors has the effect that the first error correction and error detection method, for a vector of the first set of vectors that it has detected as an erroneous but uncorrectable vector, indicates that the number of errors is less than the maximum number, the error correction of the vector of the second set of vectors is revoked.

In accordance with various embodiments, an error correction device is provided, comprising:

representing means for representing the data block as a matrix having a first set of vectors and a second set of vectors, the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector which corresponds to the component of the vector of the first set; and correction means for correcting the data block in one or more iterations, each iteration comprising applying a first error correction and error detection method in accordance with a predefined first code to the first set of vectors, wherein entries of vectors of the first set of vectors of the matrix are corrected which can be corrected by the error correction in accordance with the first code, and vectors of the first set of vectors for which the fact that they contain errors is detected, but which cannot be corrected by the error correction in accordance with the first code, are marked; and applying a second error correction and error detection method in accordance with a predefined second code to at least one portion of the second set of vectors, wherein during the error correction by means of the second error correction and error detection method, the correction of vectors of the second set of vectors which contain one or more errors which could be corrected in accordance with the second code, but relate to entries which do not belong to vectors of the first set of vectors which were marked, is skipped.

Although the invention has been shown and described primarily with reference to specific embodiments, it should be understood by those familiar with the technical field that numerous modifications can be made thereto with regard to configuration and details, without departing from the essence and scope of the invention as defined by the claims hereinafter. The scope of the invention is therefore determined by the appended claims, and the intention is for all modifications to be encompassed which come under the literal meaning or the scope of equivalence of the claims.

The invention claimed is:

1. A method for correcting a data block, comprising:

representing the data block as a matrix having a first set of vectors and a second set of vectors, the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector; and correcting the data block in one or more iterations, each iteration comprising applying a first error correction and error detection method in accordance with a predefined first code to the first set of vectors, wherein entries of vectors of the first set of vectors of the matrix that are correctable by the error correction in accordance with the first code are corrected, and wherein vectors of the first set of vectors that contain errors that are detected but that are uncorrectable by the error correction in accordance with the first code are marked; and applying a second error correction and error detection method in accordance with a predefined second code to at least one portion of the second set of vectors, wherein during the error correction by means of the second error correction and error detection method the correction of vectors of the second set of vectors that contain one or more errors that are correctable in accordance with the second code but that relate to entries that do not belong to vectors of the first set of vectors which were marked is skipped during the error correction in accordance with the second code.

2. The method of claim 1, wherein after each error correction of a vector of the second set of vectors by means of the second error correction and error detection method, the first error correction and error detection method is applied, with the first error correction and error detection method, to the vector or vectors of the first set of vectors, that was or were changed by the error correction of the vector of the second set of vectors.

3. The method of claim 1, wherein the correction strength of the first error correction and error detection method is higher than that of the second error correction and error detection method.

4. The method of claim 1, wherein, responsive to a determination that no more errors are correctable by the iterations, error-erasure decoding is applied in order to end the error correction of the data block.

5. The method of claim 1, wherein the data block is a data block that arose after readout and transmission of an original data block, wherein either or both of the processes for readout and transmission are error-prone.

6. The method of claim 1, wherein the data block contains physical measurement data or measurement data from a circuit from a semiconductor technology or photonic technology or biometric data and the first error correction and error detection method and the second error correction and error detection method use auxiliary data containing syndromes of an original data block for the error correction of the data block.

7. An error correction device, comprising data processing circuitry configured to:

receive a data block to be corrected;

represent the data block as a matrix having a first set of vectors and a second set of vectors, the first set of vectors being the row vectors and the second set the column vectors or the first set of vectors being the column vectors and the second set the row vectors of the matrix, such that each entry of the matrix is contained in a vector of the first set as a component of the vector and in a vector of the second set as a component of the vector which corresponds to the component of the vector of the first set; and correct the data block in one or more iterations, each iteration comprising applying a first error correction and error detection method in accordance with a predefined first code to the first set of vectors, wherein entries of vectors of the first set of vectors of the matrix that are correctable by the error correction in accordance with the first code are corrected, and wherein vectors of the first set of vectors that contain errors that are detected but that are not correctable by the error correction in accordance with the first code are marked; and applying a second error correction and error detection method in accordance with a predefined second code to at least one portion of the second set of vectors, wherein during the error correction, the correction of vectors of the second set of vectors that contain one or more errors that are correctable in accordance with the second code but that relate to entries that do not belong to vectors of the first set of vectors which were marked is skipped.

* * * * *